Figure 1:
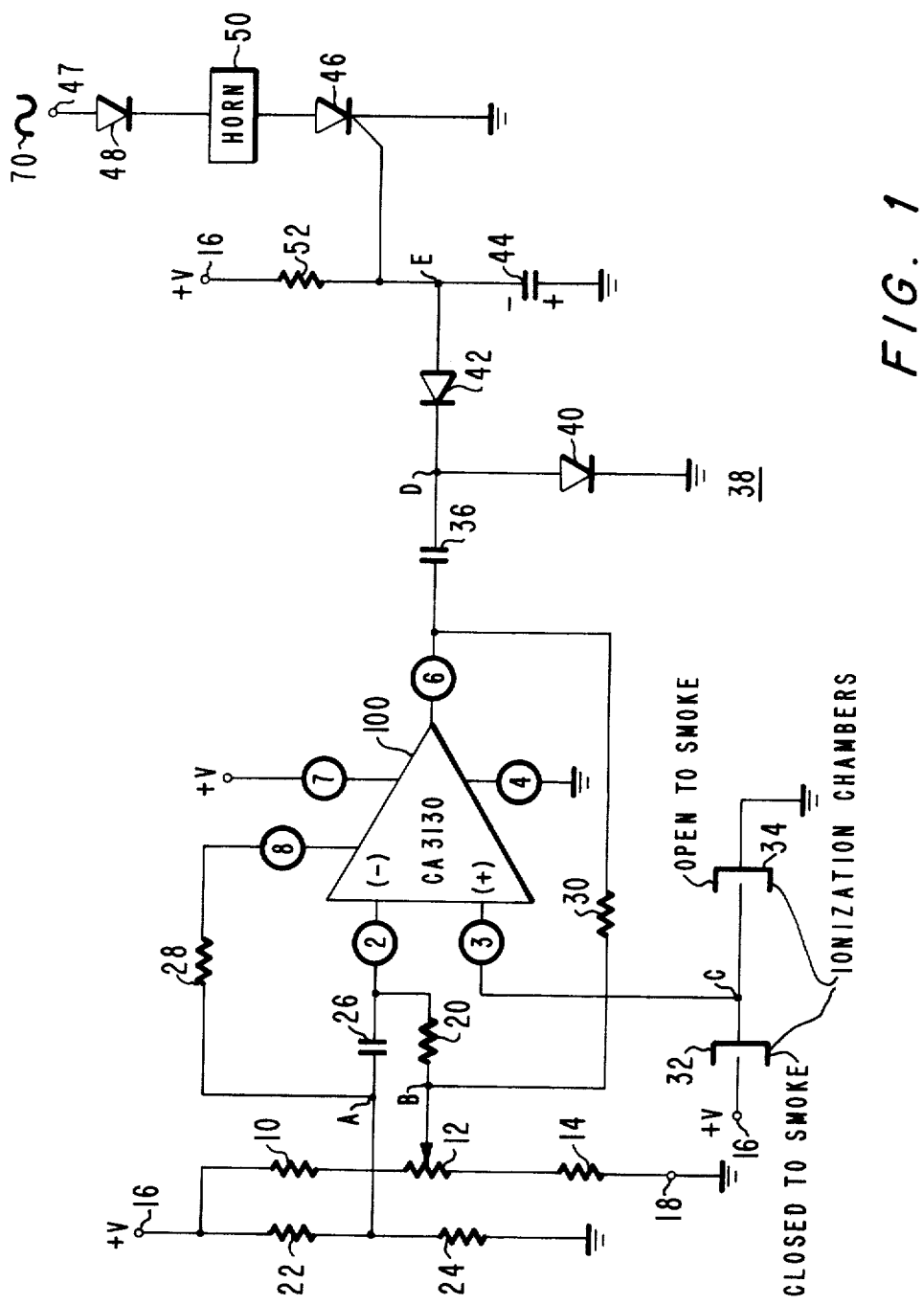

United States Patent [19]
Wittlinger

[11] 4,084,156
[45] Apr. 11, 1978

[54] VOLTAGE MONITORING CIRCUIT
[75] Inventor: Harold Allen Wittlinger, Pennington, N.J.
[73] Assignee: RCA Corporation, New York, N.Y.
[21] Appl. No.: 699,498
[22] Filed: Jun. 24, 1976
[51] Int. Cl.² ........................................ G08B 17/10
[52] U.S. Cl. .............................. 340/237 S; 250/381; 331/108 D; 331/111; 340/248 D
[58] Field of Search .......... 340/248 A, 248 D, 237 S; 324/57 Q, 61 R, 61 QS, 61 QL, 62; 328/148; 331/65, 108 C, 108 D, 111; 250/381, 382, 384, 385

[56] References Cited
U.S. PATENT DOCUMENTS
3,021,514  2/1962  Regis et al. .............. 328/148 X
3,588,690  6/1971  Griffin ..................... 324/62 R X
3,689,883  9/1972  Hill ........................ 340/59
3,781,841  12/1973 Hughes, Jr. ............... 340/251
3,805,184  4/1974  Visioli, Jr. et al. ........ 331/65

Primary Examiner—John W. Caldwell, Sr.
Assistant Examiner—Daniel Myer
Attorney, Agent, or Firm—H. Christoffersen; S. Cohen; A. L. Limberg

[57] ABSTRACT

Circuit for indicating when a voltage indicative of a condition, such as the presence of smoke, changes to a value outside of a given voltage range. It includes an oscillator which oscillates in response to a value of voltage within said range and which stops oscillating when the voltage changes to a value outside of said range. A circuit coupled to said oscillator sounds an alarm when the oscillations cease.

7 Claims, 2 Drawing Figures

VOLTAGE MONITORING CIRCUIT

The present invention relates to a circuit for sensing a voltage and, in particular, to one for sensing when the voltage is within (or outside of) a given range. Such a circuit is sometimes termed a "window detector."

There are many applications for circuits for sensing a voltage indicative of a condition. These include smoke detection, temperature detection, process control and others. In some of these applications, what is of interest is whether the condition being monitored is within a normal range. If the condition should become abnormal, it is important that this be sensed and an alarm given. The present application relates to a system of this general nature.

Figure 2:
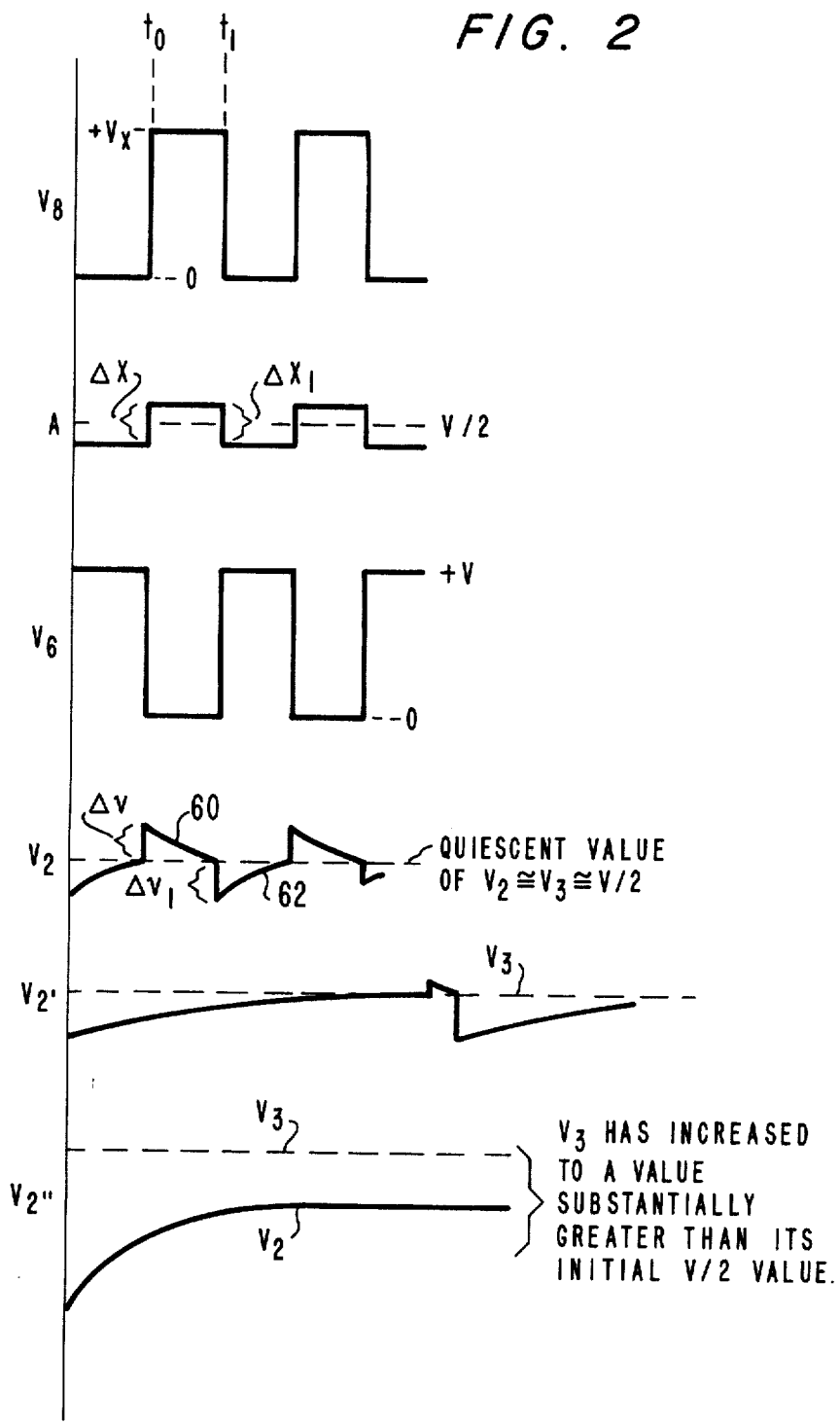

In the drawing:

FIG. 1 is a block and schematic circuit diagram of a circuit embodying the invention; and FIG. 2 is a drawing of waveforms to help explain the operation of the circuit of FIG. 1.

Referring to FIG. 1, the circuit 100 represented by the triangle is an integrated circuit operational amplifier, part No. CA3130 manufactured by RCA Corporation, the details of which are given in the handbook "RCA Linear Integrated Circuits," 1975 DataBook Series, starting on page 563. The circles with numbers within them represent the terminals of the amplifier. The amplifier produces two output voltages, one at terminal 6 and the other at terminal 8. The outputs are substantially complementary to one another. With power supply voltages $+V$ and ground, when the output voltage V at terminal 6 is at $+V$, the complementary output voltage $\overline{V}$ at terminal 8 is at ground; when the voltage V at terminal 6 is at ground, the complementary output V at terminal 8 is close to, but not quite equal to $+V$. A second characteristic of interest of this amplifier is its extremely high input impedance. As can be seen from the schematic diagram on page 566 of the handbook above, the inverting inut terminal 2 and the non-inverting input terminal 3, are connected to respective gate electrodes of MOS transistors.

The circuit of FIG. 1 includes a voltage divider comprising resistors 10, 12 and 14 connected essentially in series between operating voltage terminal 16 and a second terminal 18, the latter being at a reference voltage level, shown here are ground. The slider of the variable resistor 12 of the divider connects to mode B directly inverting and to terminal 2 of the amplifier via resistor 20. A second voltage divider input comprises resistors 22 and 24 in series between terminal 16 and ground. These resistors are of equal value and, in the absence of feedback via resistor 28, maintain node A at their interconnection at a DC level $+V/2$, where $+V$ is an operating voltage. There is a timing capacitor 26 connected between node A and terminal 2. Terminal 8 connects to node A via a feedback path comprising resistor 28. Output terminal 6 connects to node B via a second feedback path comprising resistor 30. The divided-down feedback voltage at B is applied to inverting input terminal 2 via resistor 20.

The voltage being sensed is that appearing at node C. In this particular example, this voltage is taken from the mid-point of a voltage divider made up of two ionization chambers 32 and 34 connected in series between operating voltage terminal 16 and ground. Ionization chamber 32 is closed to smoke and ionization chamber 34 is open to smoke and is for the purpose of detecting the presence of smoke. One could substitute a resistor for chamber 32 of the same value as the quiescent resistance of ionization chamber 34; however, it is preferred to use an ionization chamber at 32 as its resistance tends to vary in the same way as that of chamber 34 in the absence of smoke. The voltage developed at C, which is applied to non-inverting input terminal 3, is V/2, quiescently.

The output signal at terminal 6 of the amplifier is applied to a peak-to-peak detector shown generally at 38. This detector includes a coupling capacitor 36 and a first diode 40 connected at its anode to node D and at its cathode to ground. The circuit also includes a second diode 42 and capacitor 44. Diode 42 is connected at its cathode to node D and at its anode to node E of the circuit. Capacitor 44 is of much larger value than coupling capacitor 36 and connects between node D and ground.

The detector 38 is connected to an alarm circuit. The latter includes a silicon controlled rectifier (SCR) 46 connected at its gate electrode to node E and at its cathode to ground. An AC signal, such as the 60 Hz power line voltage, is applied to operating voltage terminal 47. This signal is rectified by diode 48 and the rectified signal is applied to an alarm device such as the horn illustrated. This horn connects at one terminal to the cathode of the diode 48 and at its other terminal to the anode of the SCR 46. Terminal 16, to which the operating voltage $+V$ is applied, connects through resistor 52 to node E.

The operation of the circuit can be better understood by referring both to FIGS. 1 and 2 in the explanation which follows. In the absence of smoke, non-inverting terminal 3 is held at a voltage $+V/2$. Inverting terminal 2 receives a DC bias of $+V/2$ and a feedback voltage. Assume to start with that output terminal 8 is at a positive level $+V_x$. (As already mentioned, in practice $+V_x$ is close to but somewhat lower than the supply voltage $+V$.) This voltage is fed back via voltage divider 28, 24, 22 to point A. The divided down portion of this voltage added to $+V/2$ initially appears at A. Assuming $+V$ to have for example a value of 10 volts, then $+V/2$ has a value of 5 volts, and the fed back voltage may result in a voltage increment $\Delta v$ such as 1 volt or so. At the same time, a complementary output voltage, ground in this example, appears at output terminal 6. It is fed back to node B via a resistor 30. The voltage at point B will be lower than V/2, its actual value depending upon the relative values of resistors 30 and the resistance from the slider through resistors 12 and 14 to ground. In the limiting case in which resistor 30 has a value of zero ohms, node B will be at ground. As resistor 30 increases in value, the voltage at B ($V_B$) becomes more positive, approaching $+V/2$ at the limit. In practice, resistor 30 will have a value chosen to obtain oscillations at a desired frequency—a typical value of this resistor is given later. The value may be such, for example, as to feed back a voltage to reduce the value of the voltage $V_B$ by one volt or so, making $V_B$ 4 volts or so. The oscillating frequency is inversely related to the value of the feedback resistor 30. This frequency is also a function of the value of capacitor 26 and various other resistances such as 28 in the circuit.

Referring to FIG. 2, it may be assumed that the time is $t_0$. The positive voltage fed back from terminal 8 to node A causes an increase $\Delta x$ in the voltage A, where $\Delta x$ is the divided down feedback voltage. When A changes in a positive direction, terminal 2 at the other plate of timing capacitor 26 instantaneously goes positive by an equal increment $\Delta v \times \Delta x$, as indicated in FIG. 2. Thereafter, capacitor 26 starts to discharge. The capacitor plate at terminal 2 starts to go relatively negative from $(V/2+\Delta v)$ toward the voltage level $V_B$ at node B, $V_B$ being less positive than $V/2$. This discharge is shown at 60, waveform $V_2$ of FIG. 2. When the discharge reaches a given level, a very small amount less than (for practical purposes, one could say equal to) the voltage $V/2$ at the non-inverting terminal 3, the operational amplifier changes its state. The voltage $V_6$ at terminal 6 switches from $-V$ (ground) to $+V$. Similarly, the voltage $V_8$ at terminal 8 switches from $+V_x$ to $-V$ (ground). The negative change in voltage at terminal 8 is manifested as a smaller voltage change $\Delta x_1$ at A due to voltage divider action as shown in FIG. 2, at time $t_1$, waveform A. When A goes relatively negative, terminal 2 instantaneously goes relatively negative by an increment $\Delta v_1 = \Delta x_1$, as shown in FIG. 2, time $t_1$; waveform $V_2$. Now capacitor 26 charges toward the $+V_B$ level as indicated at 62 in FIG. 2. The charging continues until the voltage $V_2$ reaches a value slightly more positive than (as a practical matter one could say equal to) $V/2$, whereupon the output voltages of the operational amplifier again change their value, as indicated in FIG. 2.

So long as the voltage at C remains fixed at $V/2$, the operational amplifier produces a symmetrical output wave, as shown at $V_6$ in FIG. 2. This output wave is applied to detector 38. In response to each positive-going leading edge of this wave, a positive pulse passes through coupling capacitor 36 and diode 40 to ground. In response to each negative-going leading edge of this wave, a negative pulse passes through diode 42 to capacitor 44, charging this capacitor in the polarity indicated. Between negative pulses supplied thereto via diode 42, capacitor 44 starts to discharge through resistor 52. The rate of such discharge is a function of the values of resistor 52 and capacitor 44. However, the output frequency of the operational amplifier is sufficiently high to build up and maintain a negative charge on the capacitor, that is, charge builds up on the capacitor to a level such that any losses via path 52 are exactly compensated by the negative pulses of current derived from the oscillations and applied via diode 42. The negative voltage at node E corresponding to this charge maintains the SCR 46 off, as this voltage reverse biases the gate electrode of the SCR. Accordingly, so long as the voltage at C is at $V/2$, the horn 50 is not sounded.

The SCR 46 will continue to remain reverse biased over a range of voltages $V_c$ at terminal C from $V_c + \Delta V$ to $V_c - \Delta V$, where $\Delta V$ is some small value such as 200 millivolts. In the case of such minor variations, the output wave will become asymmetrical and the frequency of this wave will decrease. However, this frequency will still be sufficient to cause a negative charge on capacitor 44 to be refreshed at a high enough rate that the SCR will remain reverse biased. In other words, so long as the voltage at C remains within a prescribed range, no alarm will be sounded by the circuit. Assuming terminal 2 to be DC biased at $V/2$, the output frequency (f) of the oscillator is maximum when $V_3 = V/2$. In other words, departures of $V_3$ from $V/2$ in either sense result in a decrease in $f$.

Assume now that smoke is present which is detected by ionization chamber 34. In response to the detection of smoke, the resistance of the ionization chamber 34 suddenly and drastically increases. As a result, the voltage at C changes from a value $V/2$ to a substantially higher value. In response to this sudden increase of voltage at C, the oscillations cease. The situation is as depicted in the waveform $V_2''$. Assume the feedback from terminal 6 to be positive. If, for example, the voltage at B is $+6$ volts, the capacitor will charge until terminal 2 reaches this value. However, the voltage at terminal 3 may be some larger value, such as 7 volts or more. Accordingly, the voltage at terminal 2 will never reach the voltage at terminal 3 and the circuit will stop oscillating.

When the circuit stops oscillating, negative pulses no longer are applied to capacitor 44. Therefore, it loses its negative charge and instead becomes positively charged via resistor 52 and DC supply 16. Current flows through resistor 52 and diodes 42 and 40 and the voltage at E attains a positive level. With the circuit as shown, if the SCR 46 were absent, the voltage across the two diodes might reach about 1.2 volts either for discrete silicon diodes or for integrated circuit diodes implemented by diode connected transistors. However, with the SCR 46 present, as shown, its gate-to-cathode threshold voltage may be about a volt or so, and the voltage at E attains this level. This forward biases the gate electrode of SCR 40 and it turns on. Now each time the alternating voltage 70 goes positive, diode 48 conducts and a pulse of current flows through horn 50 and the anode-to-cathode path of the SCR, causing the horn to sound. It is advantageous that the path through diodes 40 and 42 exhibit a higher impedance than the gate-to-cathode path of the SCR to insure that the current from source 16, 52 flows mainly into the gate electrode of the SCR. Should a SCR be chosen which has a gate-to-cathode voltage of a value very close to or larger than 1.2 volts, it is advantageous to connect one or more additional diodes in series with diode 40, poled in the same direction as diode 40, to increase the impedance of this path.

The circuit just described is "fail-safe" in the sense that if the oscillator fails for any reason, such as, for example, loss of DC power or failure of a transistor within operational amplifer 100, the horn will sound (assuming the AC source for the SCR 46 to continue to be operative and there is a voltage at terminal 16 at resistor 52 which is sufficiently positive to turn on SCR 46). This indicates to the user (in the absence of smoke) that something is amiss in the circuit.

It sometimes occurs in a circuit such as described above that voltages drift due to aging or changes in other parameters. For example, it may occur that values of resistors slowly change or that the resistance of the two ionization chambers changes in a differential fashion. As the quiescent voltages at terminals 2 and 3 drift more and more apart due to any such changes, the oscillating frequency becomes lower and lower and the degree of asymmetry of the output wave increases. FIG. 2 illustrates at $V_2'$ such a case (the waves $V_8$ and $V_6$ for this example are not illustrated), where the quiescent voltage at terminal 3 has increased to a value greater than $V/2$ while the quiescent voltage at terminal 2 has remained $V/2$. The same kind of thing occurs if the quiescent voltage $V_3$ decreases to a value lower than $V_2$; however, the oscillations produced will be complementary to those shown.

With sufficient drift of the kind discussed above, the output frequency becomes sufficiently low that capacitor 44 will remain negatively charged only part of each oscillating period. That is, a negative pulse applied through diode 42 will charge the capacitor 44 negatively and the capacitor will then have enough time to discharge through resistor 52 and to begin to charge positively before the next negative pulse arrives. During the portion of the time that capacitor 44 is charged positively, the SCR 46 will turn on and the horn will sound.

In practice, the sounding of the horn under the circumstances discussed above may be intermittent and readily can be distinguished from the sharp blast which occurs when smoke is detected. The sharp blast occurs when there is a sudden change of C to a value such as depicted at $V_2''$ in FIG. 2. The intermittent sounding of the horn is an important feature of the present circuit because it indicates to the user that the smoke alarm has become miscalibrated and that readjustment is necessary. Such readjustment generally can be made by adjusting the slider of variable resistor 12 to the center of the silent range (that is, the range within which intermittent sounding of the horn does not occur).

A typical circuit such as illustrated in FIG. 1 may have components of the following values. These are intended as examples only.

| Resistors | Value |
| --- | --- |
| 22 and 24 | 1 megohm |
| 10 and 14 | 750 kilohms |
| 12 | 500 kilohms |
| 20 | 100 kilohms |
| 28 | 5.1 megohms |
| 30 | 4.7 megohms |
| 52 | 62 kilohms |
| Capacitors | Value |
| 26 | 0.001 microfarad |
| 36 | 0.1 microfarad |
| 44 | 5 microfarads |

While the present invention has been discussed in terms of a smoke detector, it is to be understood that many other uses for the circuit are possible. In other words, while in the present illustration the voltage C is one indicative of smoke, it could instead be indicative of temperature, a process variable in an industrial process, a voltage indicative of the level of a fluid, a voltage indicative of noxious fumes other than smoke, a voltage indicative of position, and so on.

What is claimed is:

1. A circuit for signalling the presence of an excessive concentration of ionized particles in an otherwise non-ionized or relatively weakly ionized fluid comprising, in combination:

a voltage supply;

a first ionization chamber open to said fluid;

resistance means connected with said first ionization chamber in a series combination across said voltage supply, said series combination operating as a voltage divider providing a divided voltage, which divided voltage is within a given range when the concentration of ionized particles in said ionization chamber does not exceed a limit and which divided voltage is outside said range when said concentration of ionized particles does exceed said limit;

a voltage controlled oscillator having an input terminal to which said divided voltage is directly applied for producing oscillations in response to said divided voltage when the latter is within said range and for ceasing to oscillate when said voltage is outside of said range;

an alarm circuit for producing an alarm in response to a voltage applied thereto of a first value and for remaining inactive in response to a voltage applied thereto of a second value; and means responsive to the oscillations produced by said oscillator for applying to said alarm circuit a voltage of said second value and responsive to the absence of said oscillations for applying to said alarm circuit a voltage of said first value.

2. A circuit as set forth in claim 1, wherein said oscillator comprises:

a differential-input amplifier having first and second input terminals and an output terminal, said divided voltage being applied to said first input terminal;

means for biasing said second input terminal at a reference voltage level; and feedback loop means connected between said output terminal and a single one of said first and second input terminals for applying thereto a voltage of a sense to change the state of said amplifier from a first to a second state when the amplifier switches from its second to its first state, and vice versa.

3. A circuit as set forth in claim 1, wherein said means responsive to oscillations comprises:

a capacitance means;

means for charging said capacitance means in one sense, in response to the absence of said oscillations, for developing across said capacitance means said voltage of said one value; and means for charging said capacitance means in the opposite sense in response to the presence of said oscillations, for developing across said capacitance means said voltage of said second value.

4. A circuit as set forth in claim 3, wherein said means for charging said capacitance means in said opposite sense comprises means for produce pulses in response to said oscillations, and diode means responsive to said pulses for applying pulses of a given polarity to said capacitance means, and wherein said means for charging said capacitance means in one sense comprises a direct current charging circuit connected across said capacitance means.

5. A circuit for monitoring a voltage comprising, in combination:

a voltage controlled oscillator having an input terminal to which said voltage is directly applied for producing oscillations in response to said voltage, at a frequency which is a function of the value of said voltage, and which stops oscillating when said voltage is outside of a given range;

means responsive to the oscillations, when present, for producing a pulse of given polarity once each period of said oscillations;

a capacitor;

means for applying said pulses to said capacitor for charging the same in a given polarity; and means for discharging said capacitor between pulses towards a charge level of opposite polarity at a rate such that when the frequency of said oscillations is within said given frequency range, the capacitor remains charged in a given polarity, when the frequency of said oscillations is lower than said given frequency range, the capacitor discharges between pulses to said opposite polarity, and when said oscillations cease, said capacitor discharges to and remains at said charge level of said opposite polarity.

6. In combination:

an operational amplifier having an inverting input terminal and a non-inverting input terminal and having first and second output terminals for producing an output voltage V and a complementary output voltage $\overline{V}$, respectively;

means for applying a reference voltage to one of said input terminals;

means for applying a bias voltage to the other of said input terminals approximately equal to said reference voltage;

a capacitor having a first plate connected to said inverting input terminal and having a second plate;

a feedback circuit connected to said first output terminal and responsive to said output voltage V for applying a feedback voltage to the second plate of said capacitor;

a feedback circuit connected to said second output terminal and responsive to said output voltage $\overline{V}$ for applying a feedback voltage to the first plate of said capacitor; and circuit means coupled across said capacitor for permitting the same to charge and discharge, whereby each time the charge on said capacitor reaches a level such that the voltage at said inverting input terminal reaches and, in one case, then becomes slightly greater than that at the non-inverting input terminal, and in the other case reaches and then becomes slightly less than that at the non-inverting input terminal, the output voltages V and $\overline{V}$ change their values.

7. A circuit as set forth in claim 1 wherein said resistance means comprises a second ionization chamber closed to said fluid.

* * * * *

UNITED STATES PATENT OFFICE
CERTIFICATE OF CORRECTION

PATENT NO. : 4,084,156

DATED : April 11, 1978

INVENTOR(S) : Harold Allen Wittlinger

It is certified that error appears in the above-identified patent and that said Letters Patent are hereby corrected as shown below:

Col. 1, line 36, "V" should be -- $\overline{V}$ --.

Col. 1, line 40, "inut" should be -- input --.

Col. 1, line 47, "are" should be -- as --.

Col. 1, line 48, "mode" should be -- node --.

Col. 1, line 49, "inverting and to terminal 2" should be -- and to inverting input terminal 2 --.

Col. 1, line 50, "input" should be deleted.

Col. 3, line 2, "$\Delta v \times \Delta x$" should be -- $\Delta v = \Delta x$ --.

Col. 8, line 11, "V" (second occurrence) should be -- $\overline{V}$ --.

Signed and Sealed this

Thirty-first Day of October 1978

[SEAL]

Attest:

RUTH C. MASON
*Attesting Officer*

DONALD W. BANNER
*Commissioner of Patents and Trademarks*